(12) United States Patent
Wang et al.

(10) Patent No.: US 6,548,402 B2
(45) Date of Patent: Apr. 15, 2003

(54) METHOD OF DEPOSITING A THICK TITANIUM NITRIDE FILM

(75) Inventors: Shulin Wang, Campbell, CA (US); Ming Xi, Milpitas, CA (US); Frederick Wu, Cupertino, CA (US); Ramanujapuram A. Srinivas, San Jose, CA (US); Yehuda Demayo, San Jose, CA (US); Zvi Lando, Palo Alto, CA (US); Mei Chang, Saratoga, CA (US); Russell C. Ellwanger, San Juan Bautista, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/330,696

(22) Filed: Jun. 11, 1999

(65) Prior Publication Data

US 2002/0064598 A1 May 30, 2002

(51) Int. Cl.[7] .............................................. C23C 16/34
(52) U.S. Cl. ................ 438/680; 438/685; 427/255.391; 427/255.394; 427/255.7
(58) Field of Search .................... 427/255.391, 255.394, 427/255.7; 438/680, 685

(56) References Cited

U.S. PATENT DOCUMENTS

| | | | |
|---|---|---|---|
| 4,535,000 A | 8/1985 | Gordon | 427/160 |
| 4,897,709 A | 1/1990 | Yokoyama et al. | 357/68 |
| 5,378,501 A | 1/1995 | Foster et al. | 427/255 |
| 5,416,045 A | 5/1995 | Kauffman et al. | 437/174 |
| 5,420,072 A | 5/1995 | Fiordalice et al. | 437/192 |
| 5,462,895 A | * 10/1995 | Chen | |
| 5,593,511 A | 1/1997 | Foster et al. | 148/238 |
| 5,610,106 A | 3/1997 | Foster et al. | 437/245 |
| 5,840,628 A | * 11/1998 | Miyamoto | |
| 5,866,213 A | 2/1999 | Foster et al. | 427/573 |

FOREIGN PATENT DOCUMENTS

| | | | | |
|---|---|---|---|---|
| JP | 06196482 A | * | 7/1994 | |
| JP | 06-196482 | * | 7/1994 | |
| JP | 10-209278 | | 9/1998 | ......... H01L/21/768 |
| WO | 95/33865 | | 12/1995 | ........... C23C/16/02 |

OTHER PUBLICATIONS

Gross et al."Effect of NH, Plasma Treatment on Etching of Ti During $TiCl_4$–Based TiN CVD Processes" Mat. Res. Soc. Symp. Proc., vol. 514, pp. 523–529, 1998 (No Month).

Buiting et al"Kinetical Aspects of the LPCVD of Titanium Nitride from Titanium Tetrachloride and Amonia" J. Electrochem. Soc., vol. 138, No. 2, pp. 500–505, Feb. 1991.

Mori et al. "Contact Plug Formed with Chemical–Vapour–Deposited TiN" Abstracts of the 1991 International Conference on Solid State Devices and Materials, pp. 210–212, 1991 (No Month).

Yokoyama et al. "LPCVD Titanium Nitride for ULSIs" J. Electrochem Soc., vol. 138, No. 1, pp. 190–195, Jan. 1991, (No Month).

Kurtz e t al. "Chemical Vapor Deposition of Titanium Nitride at Low Temperatures" Thin Solid Films, vol. 140, pp. 277–290, 1985, (No Month).

Bouteville et al. "Low Temperature Rapid Thermal Low Pressure Chemical Vapor Deposition of (111) Oriented TiN Layers from the $TiCl_4$–$NH_3$–$H_2$ Gaseous Phase" Microelectronic Enginerring 37/38, pp.421–425, 1997, (No Month).

Erkov et al. "Deposition and Properties of Titanium Nitride Films Obtained by $TiCl_4$ Ammonolysis in the LPCVD Process" Russian Microelectronics, vol. 27, No. 3, pp. 183–187, 1998, (No Month).

* cited by examiner

*Primary Examiner*—Timothy Meeks
(74) *Attorney, Agent, or Firm*—Moser Paterson & Sheridan

(57) ABSTRACT

A method of forming a titanium nitride (TiN) layer using a reaction between ammonia ($NH_3$) and titanium tetrachloride ($TiCl_4$). In one embodiment, an $NH_3$:$TiCl_4$ ratio of about 8.5 is used to deposit a TiN layer at a temperature of about 500° C. at a pressure of about 20 torr. In another embodiment, a composite TiN layer is formed by alternately depositing TiN layers of different thicknesses, using process conditions having different $NH_3$:$TiCl_4$ ratios. In one preferred embodiment, a TiN layer of less than about 20 Å is formed at an $NH_3$:$TiCl_4$ ratio of about 85, followed by a deposition of a thicker TiN layer at an $NH_3$:$TiCl_4$ ratio of about 8.5. By repeating the alternate film deposition using the two different process conditions, a composite TiN layer is formed. This composite TiN layer has an improved overall step coverage and reduced stress, compared to a standard TiN process, and is suitable for small geometry plug fill applications.

26 Claims, 8 Drawing Sheets

METHOD OF DEPOSITING A THICK TITANIUM NITRIDE FILM

BACKGROUND OF THE DISCLOSURE

1. Field of the Invention

The invention relates to a method of titanium nitride film deposition and, more particularly, to a method of forming a thick, crack-free titanium nitride film.

2. Description of the Background Art

In the manufacture of integrated circuits, a titanium nitride film is often used as a metal barrier layer to inhibit the diffusion of metals into an underlying region beneath the barrier layer. These underlying regions include transistor gates, capacitor dielectric, semiconductor substrates, metal lines, and many other structures that appear in integrated circuits.

For example, when an electrode is being formed for a transistor's gate, a diffusion barrier is often formed between the gate material and a metal that serves as the contact portion of the electrode. The diffusion barrier inhibits the diffusion of the metal into the gate material, which may be composed of polysilicon. Such metal diffusion is undesirable because it would change the characteristics of the transistor, or render it inoperative. A combination of titanium/titanium nitride (Ti/TiN), for example, is often used as a diffusion barrier.

The Ti/TiN stack has also been used to provide contacts to the source and drain of a transistor. For example, in forming a contact using a tungsten (W) plug process, a Ti layer is deposited upon a silicon (Si) substrate, followed by conversion of the Ti layer into titanium silicide ($TiSi_x$), which provides a lower resistance contact with Si. A TiN layer is then formed upon the $TiSi_x$ layer, prior to forming the tungsten plug. In addition to being a barrier layer, the TiN layer serves two additional functions: 1) prevents chemical attack of $TiSi_x$ by tungsten hexafluoride ($WF_6$) during W deposition; and 2) acts as a glue layer to promote adhesion of the W plug.

Ti and TiN films can be formed by physical or chemical vapor deposition. A Ti/TiN combination barrier layer may be formed in a multiple chamber "cluster tool" by depositing a Ti film in one chamber followed by TiN film deposition in another chamber. When depositing both Ti and TiN using chemical vapor deposition (CVD), titanium tetrachloride ($TiCl_4$), for example, may be used to form both Ti and TiN films when allowed to react with different reactant gases, i.e., under plasma conditions, Ti is formed when $TiCl_4$ reacts with $H_2$, and TiN is formed when $TiCl_4$ reacts with nitrogen. In general, TiN can be formed by reacting $TiCl_4$ with a nitrogen-containing compound under either plasma or thermal conditions, depending on the specific nitrogen-containing compound. Thus, a TiN film may be formed by high temperature CVD using a reaction between $TiCl_4$ and ammonia ($NH_3$). However, such a TiN film tends to have intrinsically high tensile stress, e.g., on the order of $2 \times 10^{10}$ dyne/$cm^2$ for a film thickness of 200 Å. Since tensile force increases with increasing film thickness, cracks begin to develop as the thickness exceeds about 400 Å. In fact, both the density and size of the cracks increase with film thickness, until the film eventually peels off.

Therefore, a need exists in the art for a method of forming reliable thick TiN films having improved properties such as good step coverage and low stress.

SUMMARY OF THE INVENTION

The present invention is a method of forming a titanium nitride (TiN) layer using a reaction between $NH_3$ and $TiCl_4$. In one embodiment of the invention, a TiN layer is formed at a temperature of less than about 550° C. and a pressure between about 10–50 torr. More preferably, the TiN layer is formed at a temperature of about 500° C., a pressure of about 20 torr and an $NH_3$:$TiCl_4$ ratio of about 8.5.

In another embodiment, a TiN layer is formed by depositing alternate TiN layers using two process steps having different $NH_3$:$TiCl_4$ ratios. Preferably, both process steps are performed at a temperature of about 500° C. The alternate TiN layers differ in their film characteristics, such as stress, step coverage and crystal structure. A final TiN layer comprising a composite of these alternate layers has an improved overall step coverage and stress properties compared to a TiN layer deposited using prior art processes. In one preferred embodiment, a first TiN layer is deposited to a first thickness, for example, less than about 20 Å, at an $NH_3$:$TiCl_4$ ratio between 40 and 250. This first TiN layer tends to have a lower film stress. This is followed by depositing a second TiN layer to a second thickness, for example, between 150–300 Å, using a $NH_3$:$TiCl_4$ ratio between 2.5 and 17, or preferably about 8.5. The second TiN layer has excellent step coverage but higher film stress. By repeatedly forming these two alternate layers, a final composite TiN layer, e.g., over 1000 Å thick, can be formed with an overall improvement in both step coverage and film stress. In general, the specific process step used to form the initial TiN layer is immaterial, and the alternate layers can be deposited to different thicknesses as appropriate. The composite TiN layer formed using the present invention is well-suited for plug-fill applications for geometries at or below 0.18 μm.

BRIEF DESCRIPTION OF THE DRAWINGS

The teachings of the present invention can be readily understood by considering the following detailed description in conjunction with the accompanying drawings, in which:

FIG. 4b depicts a graph showing the stress and resistivity of the TiN film of FIG. 4a;

FIG. 5b depicts a graph showing the stress and resistivity of the TiN film of FIG. 5a.

To facilitate understanding, identical reference numerals have been used, where possible, to designate identical elements that are common to the figures.

DETAILED DESCRIPTION

The present invention addresses the problem of stress-induced cracking in thick titanium nitride (TiN) films. A thick TiN film, for example, may be used for plug applications in sub-0.18 μm technology. Any cracks in the film will result in an increased film resistivity, which directly affects the contact resistance in the contact hole. The invention allows relatively thick, low stress TiN films to be formed using a reaction between $NH_3$ and $TiCl_4$. In one embodiment, a TiN layer is deposited at an $NH_3$:$TiCl_4$ ratio of between 2.5 and 17, and more preferably, about 8.5, and a process temperature of about 500° C. In another embodiment, a TiN layer is formed by alternately depositing TiN films of different thicknesses using two different $NH_3$:$TiCl_4$ ratios, preferably at a temperature of about 500° C. In particular, one process step involves forming a thin TiN film with low stress, while the other process step is used to deposit a thicker TiN film having improved step coverage, but higher film stress. These two process steps are repeated until a final desired TiN layer thickness is attained. This invention results in a thick TiN film with good overall step coverage and reduced stress. The two-step approach allows for larger process margins, and results in a composite TiN layer having improved characteristics (e.g., reduced stress) compared to that obtained using the single-step approach.

System 10

Figure 1:
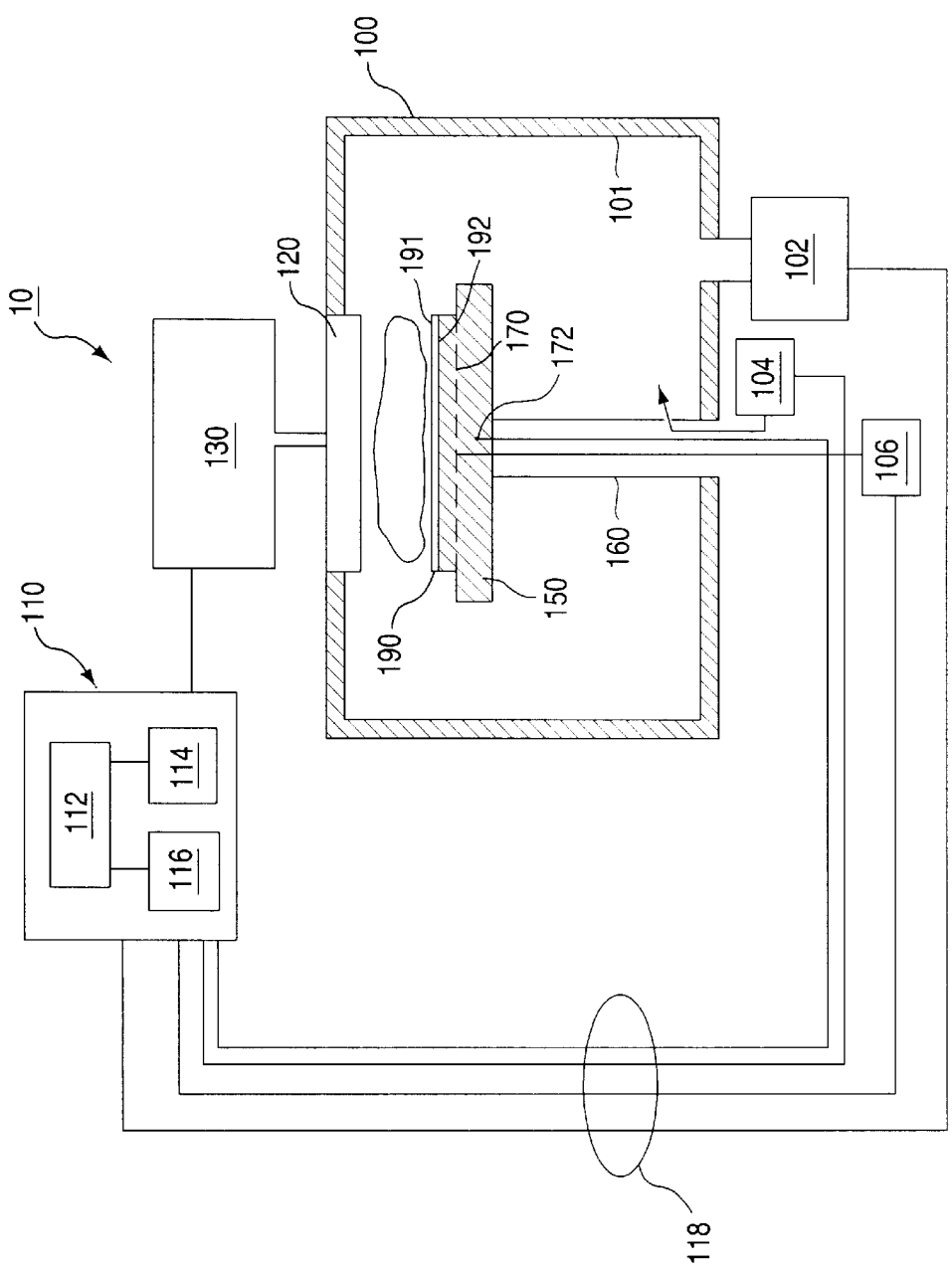
FIG. 1 depicts a schematic illustration of an apparatus that can be used for the practice of this invention.

FIG. 1 is a schematic representation of a wafer processing system 10 that can be used to practice embodiments of the present invention. The system 10 typically comprises a process chamber 100, a gas panel 130, a control unit 110, along with other hardware components such as power supplies and vacuum pumps. One example of the process chamber 100 is a TiN chamber, which has previously been described in a commonly-assigned U.S. patent application entitled "High Temperature Chemical Vapor Deposition Chamber," Ser. No. 09/211,998, filed on Dec. 14, 1998, and is herein incorporated by reference. Some key features of the system 10 are briefly described below.

Chamber 100

The process chamber 100 generally comprises a support pedestal 150, which is used to support a substrate such as a semiconductor wafer 190 within the process chamber 100. This pedestal 150 can typically be moved in a vertical direction inside the chamber 100 using a displacement mechanism (not shown). Depending on the specific process, the wafer substrate 190 has to be heated to some desired temperature prior to processing. In the present invention, the wafer support pedestal 150 is heated by an embedded heater 170. For example, the pedestal 150 may be resistively heated by applying an electric current from an AC supply 106 to the heater element 170. The wafer 190 is, in turn, heated by the pedestal 150, and can be maintained within a process temperature range of, for example, 400–750° C. A temperature sensor 172, such as a thermocouple, is also embedded in the wafer support pedestal 150 to monitor the temperature of the pedestal 150 in a conventional manner. For example, the measured temperature may be used in a feedback loop to control the power supply 106 for the heating element 170 such that the wafer temperature can be maintained or controlled at a desired temperature which is suitable for the particular process application.

Proper control and regulation of the gas flows through the gas panel 130 is performed by mass flow controllers (not shown) and a controller unit 110 such as a computer. The showerhead 120 allows process gases from the gas panel 130 to be uniformly distributed and introduced into the chamber 100. Illustratively, the control unit 110 comprises a central processing unit (CPU) 112, support circuitry 114, and memories containing associated control software 116. This control unit 110 is responsible for automated control of the numerous steps required for wafer processing—such as wafer transport, gas flow control, temperature control, chamber evacuation, and so on. Bi-directional communications between the control unit 110 and the various components of the system 10 are handled through numerous signal cables collectively referred to as signal buses 118, some of which are illustrated in FIG. 1.

A vacuum pump 102 is used to evacuate the process chamber 100 and to maintain the proper gas flows and pressure inside the chamber 100. A showerhead 120, through which process gases are introduced into the chamber 100, is located above the wafer support pedestal 150. The "dual-gas" showerhead 120 used in the present invention has two separate pathways, which allow two gases to be separately introduced into the chamber 100 without premixing. Details of the showerhead 120 have been disclosed in a commonly-assigned U.S. patent application entitled "Dual Gas Faceplate for a Showerhead in a Semiconductor Wafer Processing System," Ser. No. 09/098,969, filed Jun. 16, 1998; and is herein incorporated by reference. This showerhead 120 is connected to a gas panel 130 which controls and supplies, through mass flow controllers (not shown), various gases used in different steps of the process sequence. During wafer processing, a purge gas supply 104 also provides a purge gas, for example, an inert gas, around the bottom of the pedestal 150 to minimize undesirable deposits from forming on the pedestal 150.

TiN Film Deposition

An ideal TiN film should have low stress and good step coverage, especially for plug filling applications involving small geometries at or below 0.18 μm. Proper adjustment of deposition process conditions are required to provide a film with optimal, desirable characteristics. In the deposition of TiN using a reaction between $NH_3$ and $TiCl_4$, for example, the $NH_3$:$TiCl_4$ ratio can be adjusted to provide TiN films with varying step coverage and stress characteristics.

In a standard TiN deposition process, a pedestal temperature of over 650° C. is often used at a typical $NH_3$:$TiCl_4$ ratio of about 5. This results in a TiN film having a tensile stress on the order of $2 \times 10^{10}$ dyne/cm$^2$ for a 200 Å thick film. Cracks begin to develop in films that are about 400 Å thick. In general, TiN film stress can be reduced by lowering the deposition temperature and/or increasing the $NH_3$:$TiCl_4$ ratio. However, an increased $NH_3$:$TiCl_4$ ratio also lead to a decreased step coverage.

The present invention provides two alternative embodiments of forming a thick, crack-free TiN layer having good step coverage. One embodiment uses a process step (a) illustrated in Table 1. In a second embodiment, a "composite" TiN layer is formed by alternating between two process steps (a) and (b) having different $NH_3$:$TiCl_4$ ratios. Process parameters for these two steps (a) and (b) are illustrated in Table 1.

TABLE 1

|  | Step (a) | | Step (b) | |
| --- | --- | --- | --- | --- |
|  | Range | Preferred | Range | Preferred |
| $NH_3$ (sccm) | 30–200 | 100 | 100–500 | 150 |
| $N_2$ (sccm) | 1000–5000 | 2000 | 1000–5000 | 2000 |
| $TiCl_4$ (sccm) | 3–25 | 12 | 1–6 | 1.8 |
| $N_2$ (sccm) | 500–2500 | 1000 | 500–2500 | 1000 |
| He (sccm) | 500–2500 | 1000 | 500–2500 | 1000 |
| $NH_3$:$TiCl_4$ | 2.5–17 | 8.5 | 40–250 | 85 |
| Pedestal Temp. (° C.) | 400–600 | 500 | 400–600 | 500 |

TABLE 1-continued

| | Step (a) | | Step (b) | |
| --- | --- | --- | --- | --- |
| | Range | Preferred | Range | Preferred |
| Pressure (torr) | 5–50 | 20 | 5–50 | 20 |
| Ar (sccm) purge | 1000–5000 | 2000 | 1000–5000 | 2000 |

Figure 2A:
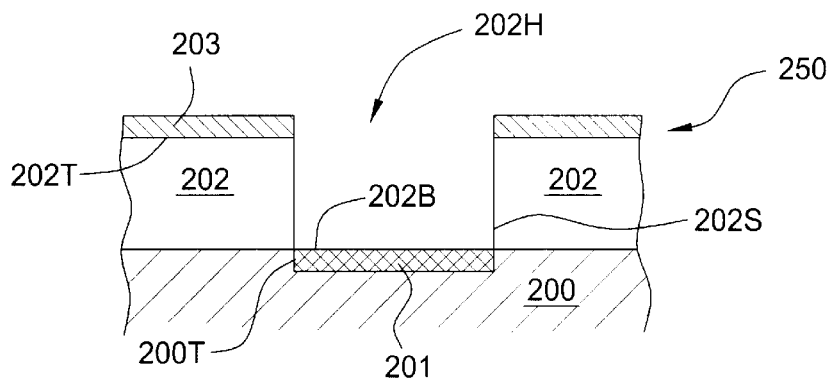
FIGS. 2a–2c depict schematic cross-sectional views of a substrate structure at different stages of integrated circuit fabrication according to one embodiment of the present invention.
Figure 2B:
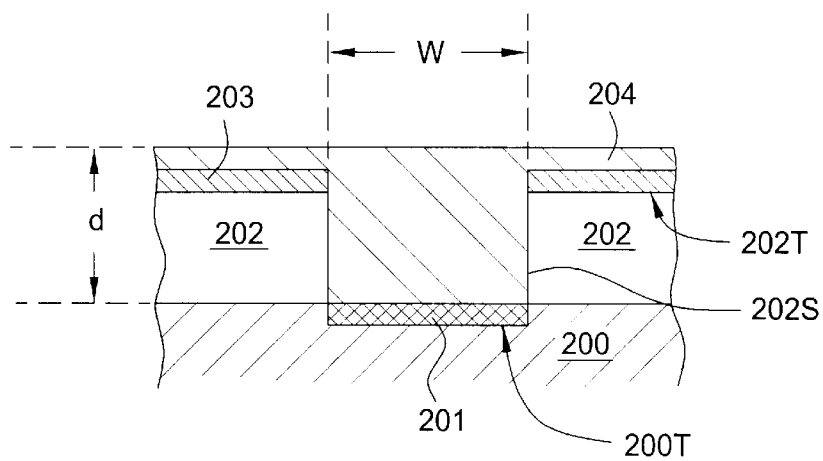
Figure 2C:
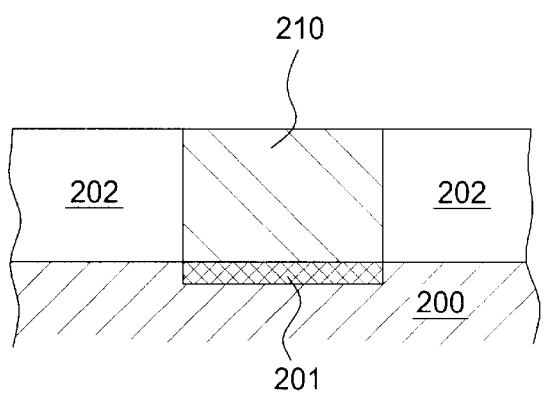

FIGS. 2a–c illustrate schematically cross-sectional views of a substrate 200 at different stages of an integrated circuit fabrication sequence. In general, the substrate 200 refers to any workpiece upon which film processing is performed, and a substrate structure 250 is used to generally denote the substrate 200 together with other material layers formed upon the substrate 200. Depending on the specific stage of processing, the substrate 200 may correspond to a silicon semiconductor wafer, or other material layer which has been formed upon the wafer. FIG. 2a, for example, illustrates a cross-sectional view of a substrate structure 250, having a material layer 202 that has been conventionally formed and patterned (e.g., by lithography and etch) upon the substrate 200. The material layer 202 may be an oxide (e.g., $SiO_2$), that has been patterned to form a contact hole 202H extending to the top surface 200T of the substrate 200. In general, the substrate 200 may be a layer of silicon, silicides, or other materials. FIG. 2a illustrates one embodiment in which the substrate 200 is silicon, and a silicide layer 201, e.g., titanium silicide ($TiSi_x$), among others, has been formed at the bottom 202B of the contact hole 202H. The $TiSi_x$ layer 201 may be formed, for example, by depositing Ti (e.g., by physical vapor deposition or CVD) over the silicon substrate 200 and the patterned oxide 202, followed by a high temperature anneal, which results in the formation of the $TiSi_x$ layer 201. The unreacted Ti layer 203 remains over the top 202T of the oxide layer 202 (no Ti is formed at the side 202S of the contact hole 202H because of non-conformal Ti deposition.) FIG. 2b depicts a TiN layer 204 deposited upon the substrate structure 250 of FIG. 2a.

In one embodiment of the present invention, the TiN film 204 is formed in a CVD chamber similar to chamber 100 of FIG. 1, using a reaction between $NH_3$ and $TiCl_4$ according to process step (a) of Table 1. After a wafer 190 having the substrate structure 250 is loaded onto the wafer support pedestal 150, $NH_3$ and $TiCl_4$, along with other gases, are introduced into the chamber 100 for TiN film deposition. $TiCl_4$ is introduced, along with helium (He) and nitrogen ($N_2$), via one gas line (not shown) of the dual-gas showerhead 120. $TiCl_4$, being a liquid at room temperature, is delivered to the gas line using, for example, a liquid injection system (not shown). In general, the following gas flow ranges can be used—$TiCl_4$: 3–25 sccm (calibrated from liquid flow rate), He: 500–2500 sccm, and $N_2$: 500–2500 sccm. He and $N_2$ are generally referred to as "dilutant" gases. The use of He and $N_2$ is for illustrative purpose only, and other gases such as argon (Ar) and hydrogen ($H_2$) can also be used as dilutant gases. $NH_3$, in a flow range of 30–200 sccm, is introduced into the chamber 100, along with a dilutant gas such as $N_2$ in a range of 1000–5000 sccm, via the second gas line of the dual-gas showerhead 120. The dilutant gases in either gas line can comprise either a single gas, or more than one gas in different combinations or ratios, i.e., as a gas mixture. While the exact ratio or combination of dilutant gases is not critical to the practice of the invention, it is preferable that the some "balance" be maintained between the respective gas flows in the first and second gas lines. By maintaining approximately equal gas flows in the two gas lines, potential "back flow" problems can be avoided. More preferably, the TiN deposition is performed at a $NH_3$ flow of about 100 sccm and $N_2$ flow of about 2000 sccm in the first gas line, and a $TiCl_4$ flow of about 12 sccm, $N_2$ flow of about 1000 sccm and He flow of about 1000 sccm in the second gas line. A total pressure greater than about 5 torr, e.g., in a range of 10–50 torr, and preferably about 20 torr, and a pedestal temperature in the range of 400–600° C., e.g., less than about 550° C., and more preferably about 500° C., can be used. Depending on the specific process conditions, the substrate temperature may be about 30–40° C. lower than the pedestal temperature. Furthermore, a bottom inert gas purge flow (e.g., Ar or other inert gases) of about 2000 sccm, or more generally, between 1000–5000 sccm, is also established via a separate gas line and a purge gas supply 104 provided at the bottom of the chamber 100. This gas purge flow helps minimize the accumulation of undesirable deposits at the back of the wafer support pedestal 150. Under these process conditions, a crack-free TiN layer 204, having a film stress of less than about $5 \times 10^9$ dynes/cm$^2$, and as low as $1 \times 10^9$ dynes/cm$^2$, can be formed with a step coverage of about 95% over a contact hole with a near-vertical sidewall and an aspect ratio of about 7. (Aspect ratio is defined in this illustration by the ratio of the depth d to the width w of the contact hole 202H.) The TiN layer 204 has primarily (220) and (200) crystal orientations. FIG. 2c shows the formation of a TiN plug 210 inside the contact hole 202H. The plug 210 can be formed from the structure of FIG. 2b by an appropriate planarization technique, e.g., blanket etchback or chemical mechanical polishing.

In another embodiment, a "composite" TiN layer is formed by using the process step described above, referred to as step (a), in conjunction with another process step (b). As previously mentioned, the $NH_3$:$TiCl_4$ ratio affects the deposited TiN film properties such as stress, step coverage and crystal structure. While the TiN film deposited according to process step (a) shows good step coverage, the film stress may not be optimal for thick film applications. By increasing the $NH_3$:$TiCl_4$ ratio, however, a TiN film with reduced stress can be formed. In this embodiment, TiN films of different thicknesses are deposited upon the substrate structure 250 of FIG. 2a using alternately the process conditions of step (a) and step (b).

Figures 3A, 3B, 3C, 3D:
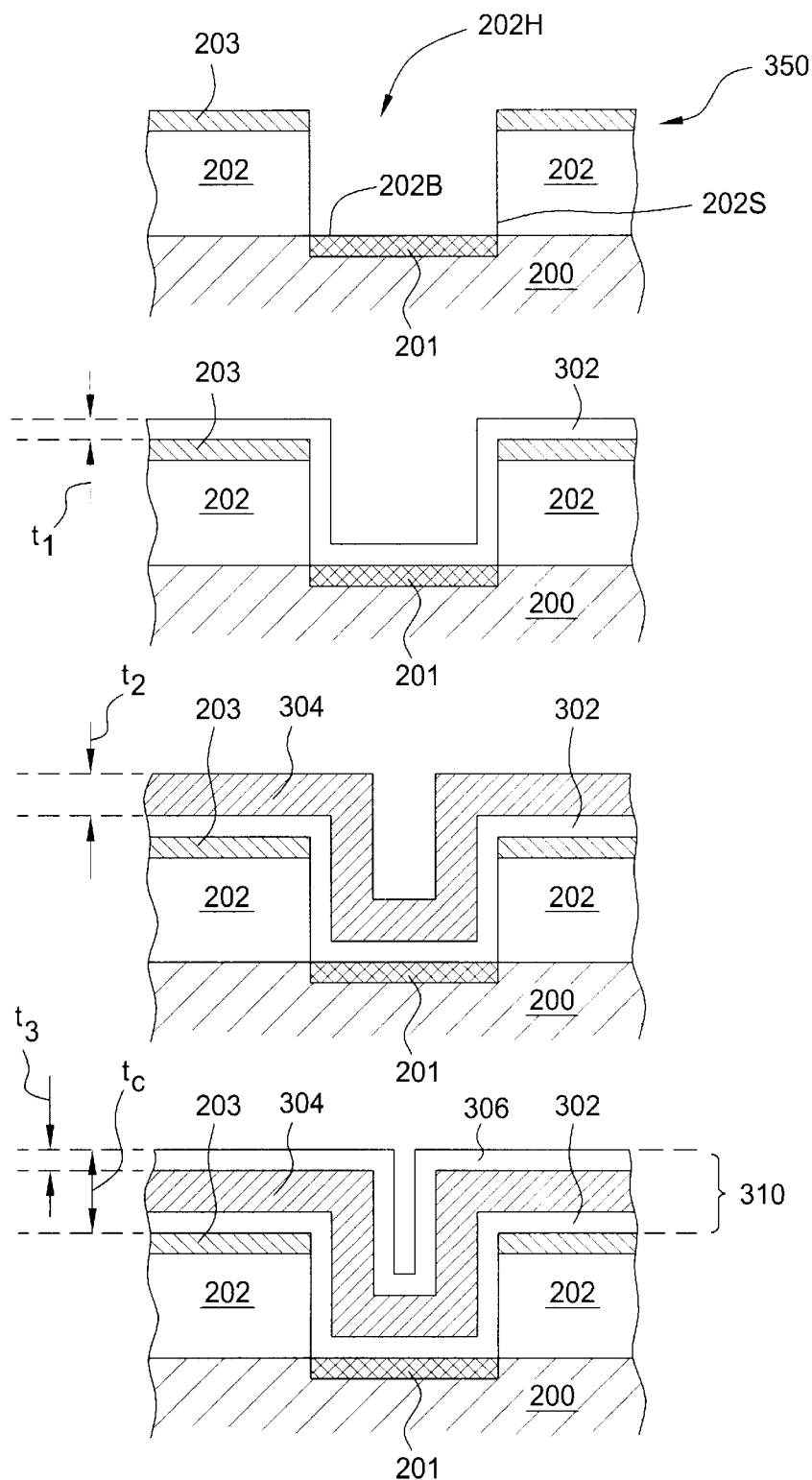
FIGS. 3a–3d depict schematic cross-sectional views of a substrate structure at different stages of integrated circuit fabrication according to another embodiment of the present invention.

FIGS. 3a–3d illustrate schematically cross-sectional views of a substrate 200 undergoing processing according to this alternative embodiment. For example, FIG. 3a shows a substrate structure 350 which is identical to that of FIG. 2a. FIG. 3b shows a first TiN layer 302 deposited upon the structure 350 to a thickness $t_1$. In general, either process step (a) or (b) may be used to form the initial TiN layer 302 upon the substrate structure 350. However, if the silicide layer 201 is primarily $TiSi_x$, then it is preferable that process step (b) be used to form the initial TiN layer 302. The TiN layer 302 formed using process step (b) exhibits a (200) crystal structure, along with the appearance of the (111) orientation. A second TiN layer 304 of thickness $t_2$ is then formed upon the layer 302 using process step (a), as shown in FIG. 3c. Since layer 304 has better step coverage compared to layer 302, it is preferable that $t_2$ be greater than $t_1$. Thereafter, process step (b) can be repeated to form a third TiN layer 306 having thickness $t_3$ upon layer 304, as shown in FIG. 3d. This alternate layer deposition using steps (a) and (b) may be repeated as often as necessary to yield a final, or composite TiN layer 310. The thickness $t_c$ of the composite TiN layer 310 is given by the sum of the thicknesses ($t_1+t_2+t_3+\ldots$) of the respective layers 302, 304, 306, . . . , and so on. In general, the alternate layers (which may also be referred to as component layers) 302, 304, 306 may be deposited to different thicknesses—e.g., layers 302 and 306 do not necessarily have the same thickness as each other. However, it is preferable that a component layer having a better step coverage be deposited to a larger thickness than another component layer having a lower stress but worse step coverage. The composite TiN layer 310 thus formed has the combined advantages of good step coverage offered by process step (a) and reduced film stress from process step (b).

For example, the TiN layer 302, having a film stress of less than about $1 \times 10^9$ dynes/cm$^2$ is deposited to a thickness $t_1$, typically less than about 20 Å. Layer 304, which has a film stress less than about $5 \times 10^9$ dynes/cm$^2$ and a step coverage of about 95%, is deposited to a thickness $t_2$ which is typically between 150–300 Å, and more preferably, about 200 Å. The procedure is repeated as often as needed, alternating between steps (a) and (b), until the final desired TiN layer thickness is obtained. For example, using an iterative process of 5 cycles of deposition, a 1000 Å thick, crack-free TiN layer is obtained with an overall step coverage of about 90%.

In particular, process step (b) entails the use of an NH$_3$:TiCl$_4$ ratio in the range of 40–250, and preferably, at about 85. The NH$_3$ flow may be in the range of 100–500 sccm, more preferably about 150 sccm; while the TiCl$_4$ flow may be in the range of 1–6 sccm, and more preferably, about 1.8 sccm. Other dilutant gas flows, temperature and pressure ranges remain the same as for step (a).

Figure 4A:
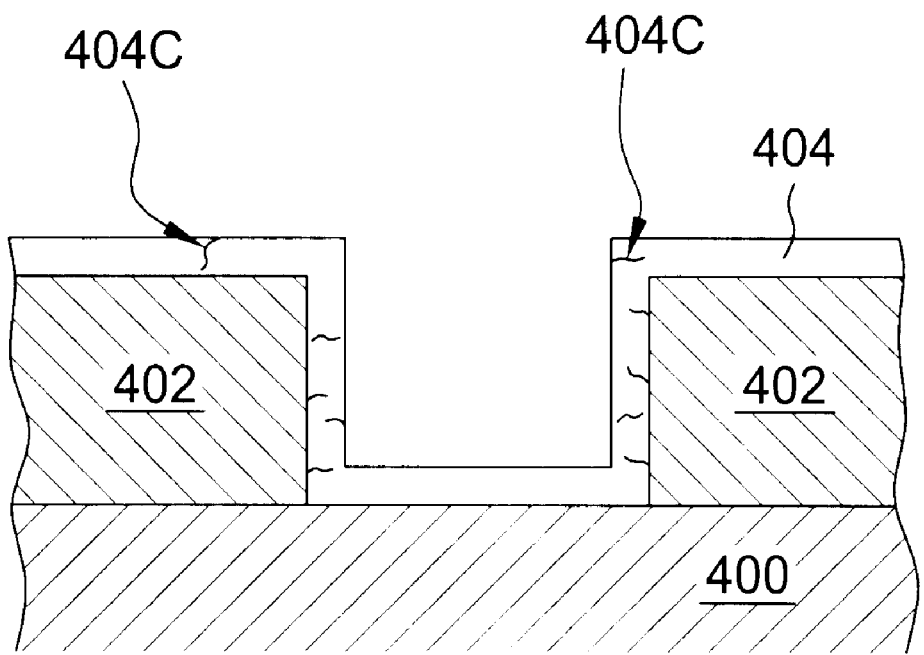
FIG. 4a depicts a schematic cross-sectional view of a TiN film exhibiting micro-cracking.
Figure 4B:
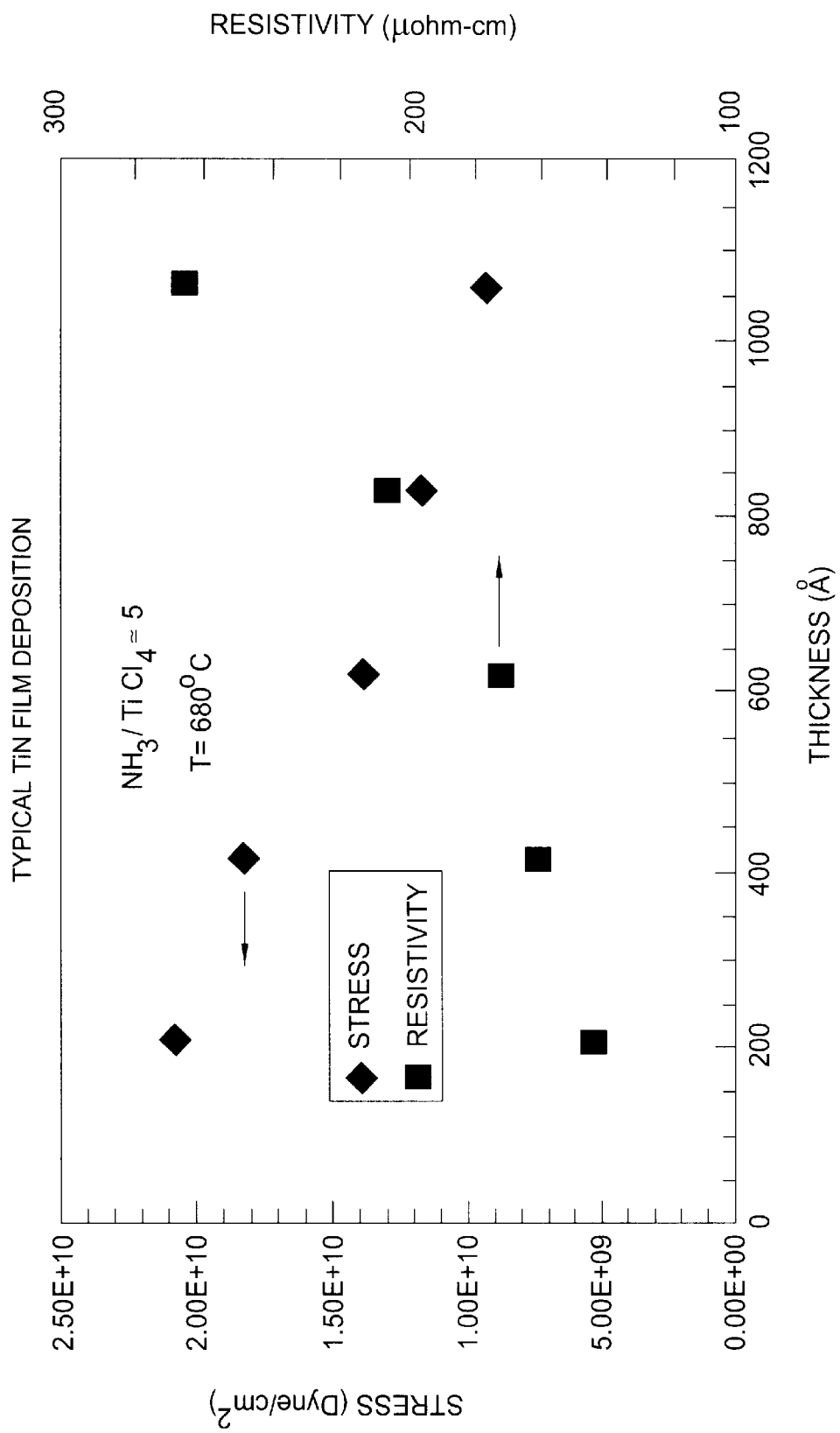

The reduction in process temperature and increase in the NH$_3$:TiCl$_4$ flow ratio are two important aspects of the present invention. The effects of these two parameters upon TiN film properties are illustrated in FIGS. 4–6. FIG. 4a shows a schematic cross-sectional view of a TiN layer 404 that is formed upon a substrate 400 and a patterned layer 402 using a standard TiCl$_4$/NH$_3$ deposition process having a NH$_3$:TiCl$_4$ ratio of about 5, at a pedestal temperature of about 680° C. The intrinsically high film stress in layer 404 results in the formation of numerous cracks 404C. FIG. 4b is a graph showing the film stress and resistivity as a function of the thickness of the TiN layer 404. As the thickness of the TiN layer 404 increases from about 200 Å to over 1000 Å, the film stress decreases from about $2 \times 10^{10}$ dynes/cm$^2$ to about $1 \times 10^{10}$ dynes/cm$^2$. This apparent paradox of decreasing film stress with increasing film thickness is explained by "micro-cracking", i.e., the appearance of cracks 404C within the layer 404, which relieves much of the film stress. Along with micro-cracking, the film resistivity also increases from about 140 to over 260 $\mu$ohm-cm.

Figure 5A:
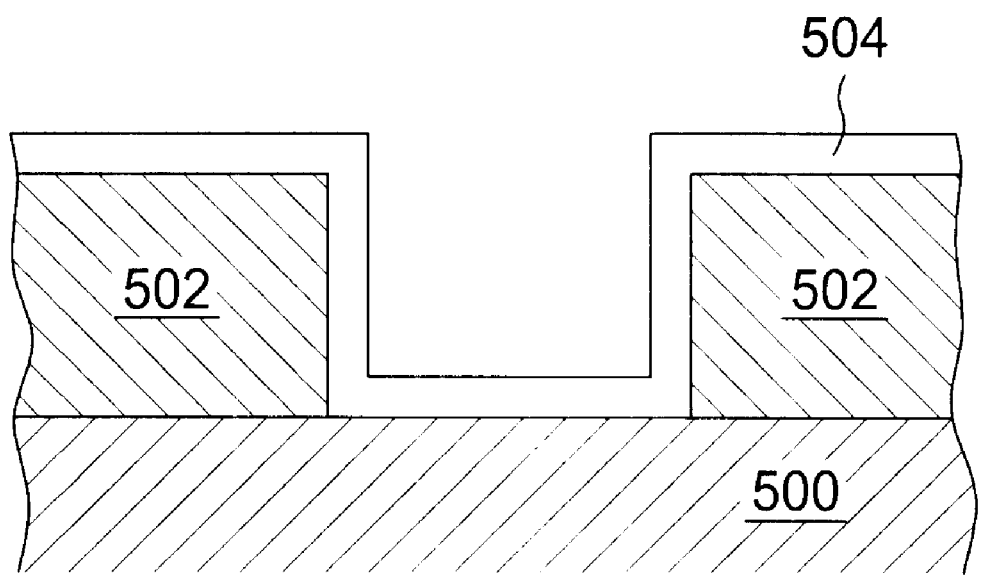
FIG. 5a depicts a schematic cross-sectional view illustrating a crack-free TiN film.
Figure 5B:
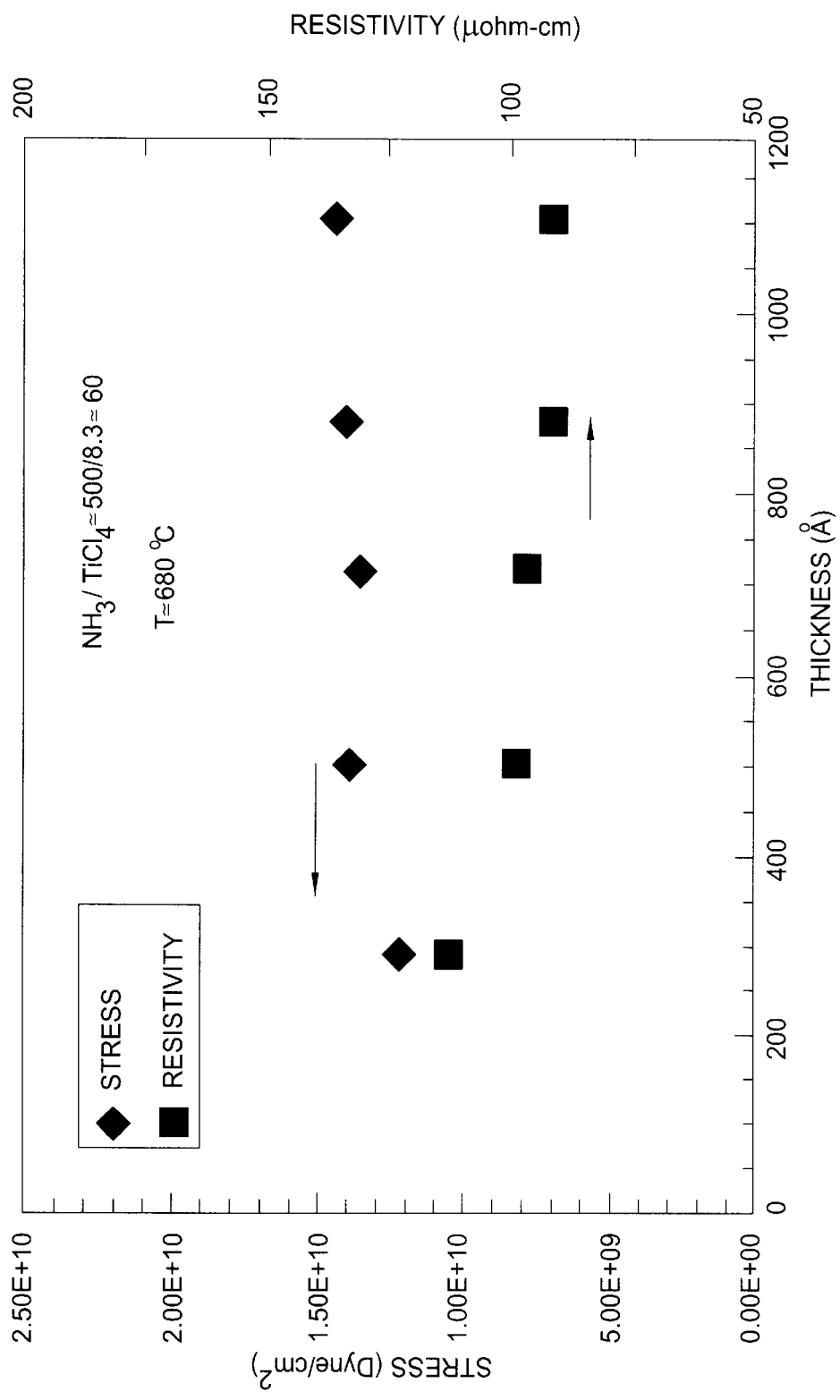
Figure 6:
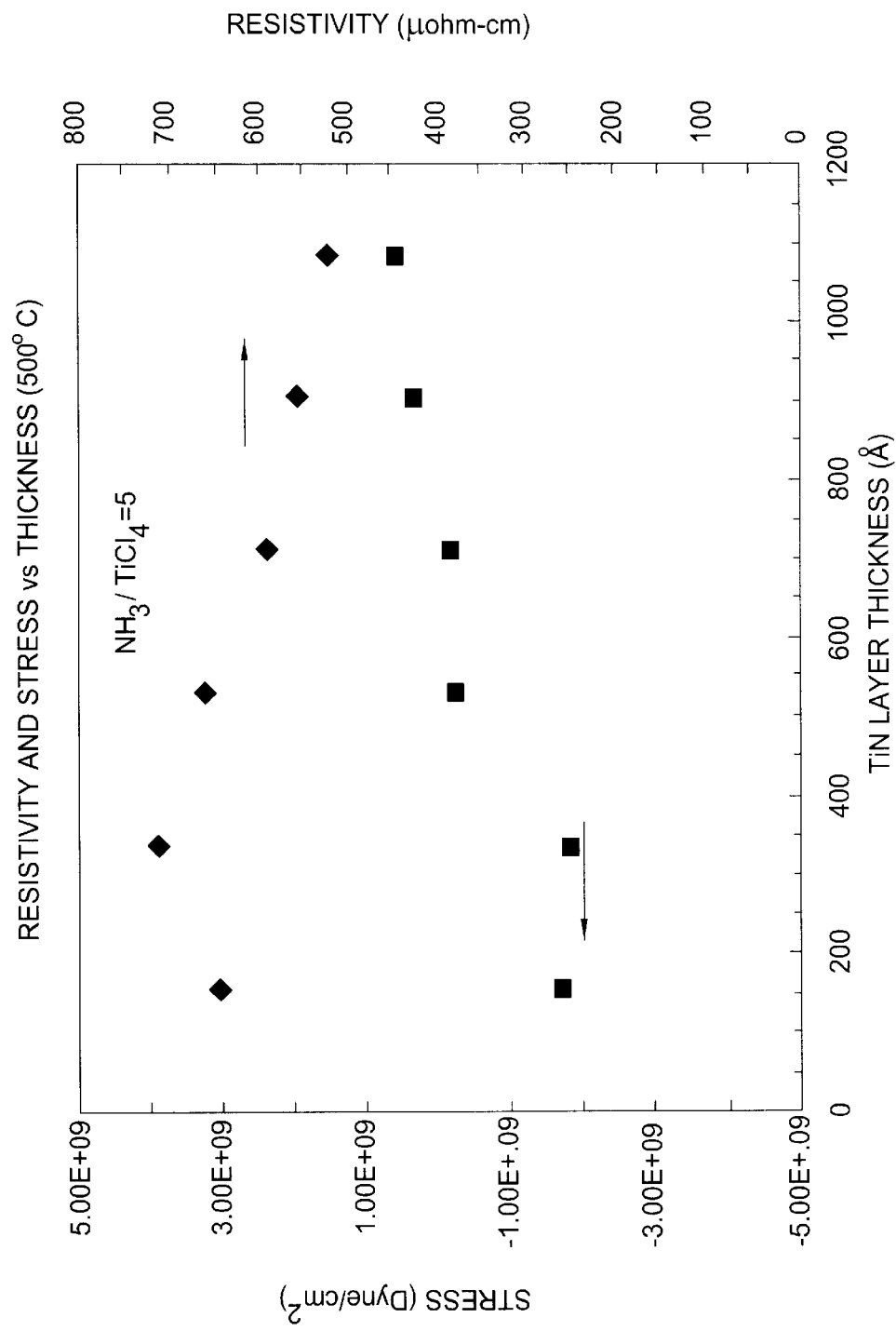
FIG. 6 depicts a graph showing the stress and resistivity of a TiN film deposited at 500° C.

FIG. 5a shows a crack-free TiN layer 504 formed upon a patterned material layer 502 and substrate 500. The layer 504 is deposited by increasing the NH$_3$:TiCl$_4$ ratio to about 60 and maintaining the process temperature at about 680° C. In contrast to the TiN layer 402 of FIG. 4a, the TiN layer 504 does not suffer from micro-cracking. The film stress stays relatively constant, on the order of $1.5 \times 10^{10}$ dynes/cm$^2$, with increasing film thickness; while the film resistivity decreases from about 120 $\mu$ohm-cm to below about 100 $\mu$ohm-cm.

A crack-free TiN layer can also be formed by reducing the process temperature to about 500° C., while keeping the NH$_3$:TiCl$_4$ ratio at about 5. FIG. 6 shows the film stress for a 1000 Å thick layer remaining below $1 \times 10^9$ dynes/cm$^2$, with a resistivity of about 500 $\mu$ohm-cm.

By reducing the process temperature and increasing the NH$_3$:TiCl$_4$ ratio relative to the standard TiN deposition process, the present invention provides a method of forming thick TiN layers with low stress and good step coverage. Although the present invention is particularly suited for applications such as plug filling, it is generally applicable to many other substrate structures encountered in various stages of integrated circuit fabrication.

Although several preferred embodiments which incorporate the teachings of the present invention have been shown and described in detail, those skilled in the art can readily devise many other varied embodiments that still incorporate these teachings.

What is claimed is:

1. A method of depositing a titanium nitride (TiN) layer upon a substrate comprising the step of:
   (a) forming a first TiN layer using a reaction between ammonia (NH$_3$) and titanium tetrachloride (TiCl$_4$) at a pressure range of about 10–50 torr, a temperature of less than about 550° C., and a first NH$_3$:TiCl$_4$ ratio of about 5 to about 17, wherein the first TiN layer has primarily <220> and <200> crystal orientations.

2. The method of claim 1, wherein said step (a) is performed at a temperature of about 500° C.

3. The method of claim 1, wherein said step (a) is performed at a pressure of about 20 torr.

4. The method of claim 1, wherein said step (a) is performed at a NH$_3$ flow rate in a range of about 30–200 sccm, and a TiCl$_4$ vapor flow rate in a range of about 3–25 sccm.

5. The method of claim 1, wherein said step (a) is performed at a first NH$_3$:TiCl$_4$ ratio of about 8.5, a process temperature of about 500° C., and a total pressure of about 20 torr.

6. The method of claim 1, further comprising the step of:
   (b) forming a second TiN layer from a reaction between NH$_3$ and TiCl$_4$ at a second NH$_3$:TiCl$_4$ ratio;
   wherein said first NH$_3$:TiCl$_4$ ratio is different from said second NH$_3$:TiCl$_4$ ratio.

7. The method of claim 6, further comprising the step of:
   (c) repeating said steps (a) and (b) to form a composite TiN layer comprising alternate first and second TiN layers.

8. The method of claim 6, wherein said second NH$_3$:TiCl$_4$ ratio is greater than about 40.

9. The method of claim 6, wherein said first NH$_3$:TiCl$_4$ ratio is about 8.5.

10. The method of claim 9, wherein said second NH$_3$:TiCl$_4$ ratio is about 85.

11. The method of claim 6, wherein said step (b) is performed at a temperature of less than about 550° C.

12. The method of claim 6, wherein said first TiN layer has a thickness between about 150–300 Å, and said second TiN layer has a thickness of less than about 20 Å.

13. The method of claim 12, further comprising the step of repeating said steps (a) and (b) to form a composite TiN layer comprising alternate first and second TiN layers.

14. A method of depositing a composite titanium nitride (TiN) layer upon a substrate, comprising the steps of:
   (a) forming a first TiN layer on the substrate using a reaction between NH$_3$ and TiCl$_4$ at a first NH$_3$:TiCl$_4$ ratio greater than about 40, wherein the first TiN layer has primarily <111> and <200> crystal orientations; and
   (b) forming a second TiN layer upon said first TiN layer using a reaction between NH$_3$ and TiCl$_4$ at a second NH$_3$:TiCl$_4$ ratio different from said first NH$_3$:TiCl$_4$ ratio;
   wherein said steps (a) and (b) are performed at a temperature of less than about 550° C.

15. The method of claim 14, wherein said first $NH_3:TiCl_4$ ratio is greater than said second $NH_3:TiCl_4$ ratio and said first TiN layer is formed at a first thickness that is less than a second thickness of said second TiN layer.

16. The method of claim 14, further comprising the step of:

(c) repeating said steps (a) and (b) to form said composite TiN layer comprising alternate first and second TiN layers.

17. The method of claim 14, wherein said first $NH_3:TiCl_4$ ratio is about 85.

18. The method of claim 14, wherein said second $NH_3:TiCl_4$ ratio is about 8.5.

19. The method of claim 14, wherein said steps (a) and (b) are performed at a process temperature of about 500° C.

20. The method of claim 14, wherein said steps (a) and (b) are performed at a pressure range of between 10–50 torr.

21. A method of depositing a composite titanium nitride (TiN) layer upon a substrate comprising the steps of:

(a) forming a first TiN layer using a reaction between $NH_3$ and $TiCl_4$ at a first $NH_3:TiCl_4$ ratio, wherein the first TiN layer has primarily <220> and <200> crystal orientations;

(b) forming a second TiN layer upon said first TiN layer using a reaction between $NH_3$ and $TiCl_4$ at a second $NH_3:TiCl_4$ ratio different from said first $NH_3:TiCl_4$ ratio; and (c) repeating said step (a) and said step (b) in an alternate manner to produce said composite TiN layer.

22. The method of claim 21, wherein said steps (a) and (b) are performed at a temperature of less than about 550° C.

23. The method of claim 22, wherein said steps (a) and (b) are performed at a pressure greater than about 5 torr.

24. The method of claim 21, wherein said first $NH_3:TiCl_4$ ratio is about 85.

25. The method of claim 21, wherein said second $NH_3:TiCl_4$ ratio is about 8.5.

26. The method of claim 21, wherein said step (a) is performed at an $NH_3$ flow rate in a range of about 30–200 sccm and a $TiCl_4$ vapor flow rate in a range of about 3–25 sccm; and said step (b) is performed at an $NH_3$ flow rate in a range of about 100–500 sccm and a $TiCl_4$ vapor flow rate in a range of about 1–6 sccm.

* * * * *